United States Patent [19]
Walburn

[11] Patent Number: 5,104,327
[45] Date of Patent: Apr. 14, 1992

[54] WIRE FORM SOCKET CONNECTOR

[75] Inventor: Douglas M. Walburn, Harrisburg, Pa.

[73] Assignee: AMP Incorporated, Harrisburg, Pa.

[21] Appl. No.: 662,058

[22] Filed: Feb. 28, 1991

[51] Int. Cl.⁵ ............................................. H01R 9/09
[52] U.S. Cl. ....................................... 439/71; 439/77; 439/492
[58] Field of Search ..................................... 439/69–71, 439/77, 492, 493

[56] References Cited

U.S. PATENT DOCUMENTS

| | | | |
|---|---|---|---|
| 3,795,884 | 3/1974 | Kotaka | 339/17 LM |
| 3,852,878 | 12/1974 | Munro | 29/629 |
| 3,960,423 | 6/1976 | Weisenburger | 439/71 |
| 3,985,413 | 10/1976 | Evans | 339/17 LM |
| 4,155,615 | 5/1979 | Zimmerman, Jr. et al. | 439/77 |
| 4,453,309 | 6/1984 | Shirk | 29/884 |

Primary Examiner—Paula A. Bradley

[57] ABSTRACT

An electrical connector (20) includes fine wires (44) adhesively bound to an insulating film (42) to form a contact strip (40) inelastically formed into a generally C-shaped configuration to provide an electrical interconnection between the contact pads (14) of a printed circuit board (12) and the contact pads (54) of an electrical component (52). An insulating housing comprised of insulating members (24) includes interior surfaces configured to receive the contact strip (40) and retain such in position with the elements being held together by a frame (22) and a plate (60) in conjunction with fasteners (18) holding the assembly of parts to the circuit board (12).

7 Claims, 7 Drawing Sheets

WIRE FORM SOCKET CONNECTOR

This invention relates to an electrical connector having wire form contacts arranged in a housing to interconnect electronic components such as chip carrier integrated circuit devices.

BACKGROUND OF THE INVENTION

The use of wire forms to provide electrical connector functions has found a particular use with respect to components such as integrated circuits and circuit boards wherein the contact traces or paths are on close centers. U.S. Pat. No. 3,852,878 teaches the use of spring wire embedded in an elastomer wound on an appropriate shape to provide a spring form with individual wire segments defining connectors. U.S. Pat. No. 3,795,884 teaches a similar connector which is C-shaped with the individual turns of wire held by an elastomer and compressed between the contact pads of circuit boards or other components. U.S. Pat. No. 4,453,309 teaches a method of manufacturing that involves winding small gauge wires helically on a drum and then bonding the wires by use of an adhesive to a flexible sheet of insulating material wrapped on the drum, the ensemble thereafter being stripped from the drum and cut into appropriate pieces to form connectors made of the lamination of wire, adhesive, and insulating material.

These patents and the teachings and references therein evidence the advantages of wire form connectors which enable interconnection of high-density circuits. Additionally, as an advantage of such devices, the need to stamp, form, plate, and handle small metallic spring elements and define plastic housings in an attempt to scale down traditional electrical connectors is avoided in a lamination that is essentially one piece in terms of process of manufacturing, handling, and use.

The present invention represents an improvement on and application of wire form laminated connectors. It is an object of the invention to provide high density sockets for use with electronic components such as integrated circuits in the form of chip carriers and the like.

The invention has as a further object to provide a socket connector having contacts on close centerlines and in a geometric configuration readily amenable to use in a variety of applications in socket housings and interconnection functions.

A still further object is to provide a simple, low-cost, high density connector having improved electrical characteristics.

SUMMARY OF THE INVENTION

The present invention utilizes a wire form lamination wherein contact elements are formed by fine wires of spring grade material selectively plated in areas or spots to define contact points. The wires are placed on close centers during lamination, and the lamination is cut into pieces that are fitted into housings that hold the laminations with the contact points in proximity and aligned relative to the conductive traces or pads on circuit boards and like structures as well as on components such as integrated circuits in packages frequently termed chip carriers. The component packages are made up of molded plastic or formed ceramic bodies having a series of conductive pads on the surfaces thereof, typically on the bottom or sides that are internally interconnected to lead frames and integrated circuit chips therewithin. These same package forms are also utilized for hybrid circuits wherein discrete devices are included, along with integrated circuits and solid state logic, memory, and power devices. The invention embraces the use of dielectrical plastic and metal parts that hold the contact lamination in position to force the lamination to be compressed in a manner to bring the contact points into engagement with the pads of the components and boards to define normal forces providing low resistance, stable electrical interconnections between the pads.

The invention housing includes plastic members having interior configured surfaces that receive the ends of the lamination and hold them for positioning and handling purposes and further allow movement of the ends resulting from the compression of the individual spring elements of the lamination. The invention contemplates variations in lamination and housing to accommodate different geometrical arrangements of pads on packages and on boards including particularly illustrated versions wherein the pads of the component are on the bottom or alternatively, on the sides of the package.

The invention connector contemplates the use of elements to effect the clamping of laminations together, effect the clamping of the laminations to the package and board and in certain instances, provide heat sinking of the component package so terminated. The invention further contemplates an overall reduction of the "real estate" or area of the board taken up by the connector due particularly to the small size and geometry achievable through the use of the connector lamination and the arrangement of the package housing.

IN THE DRAWINGS

DETAILED DESCRIPTION OF THE INVENTION

Figure 1:
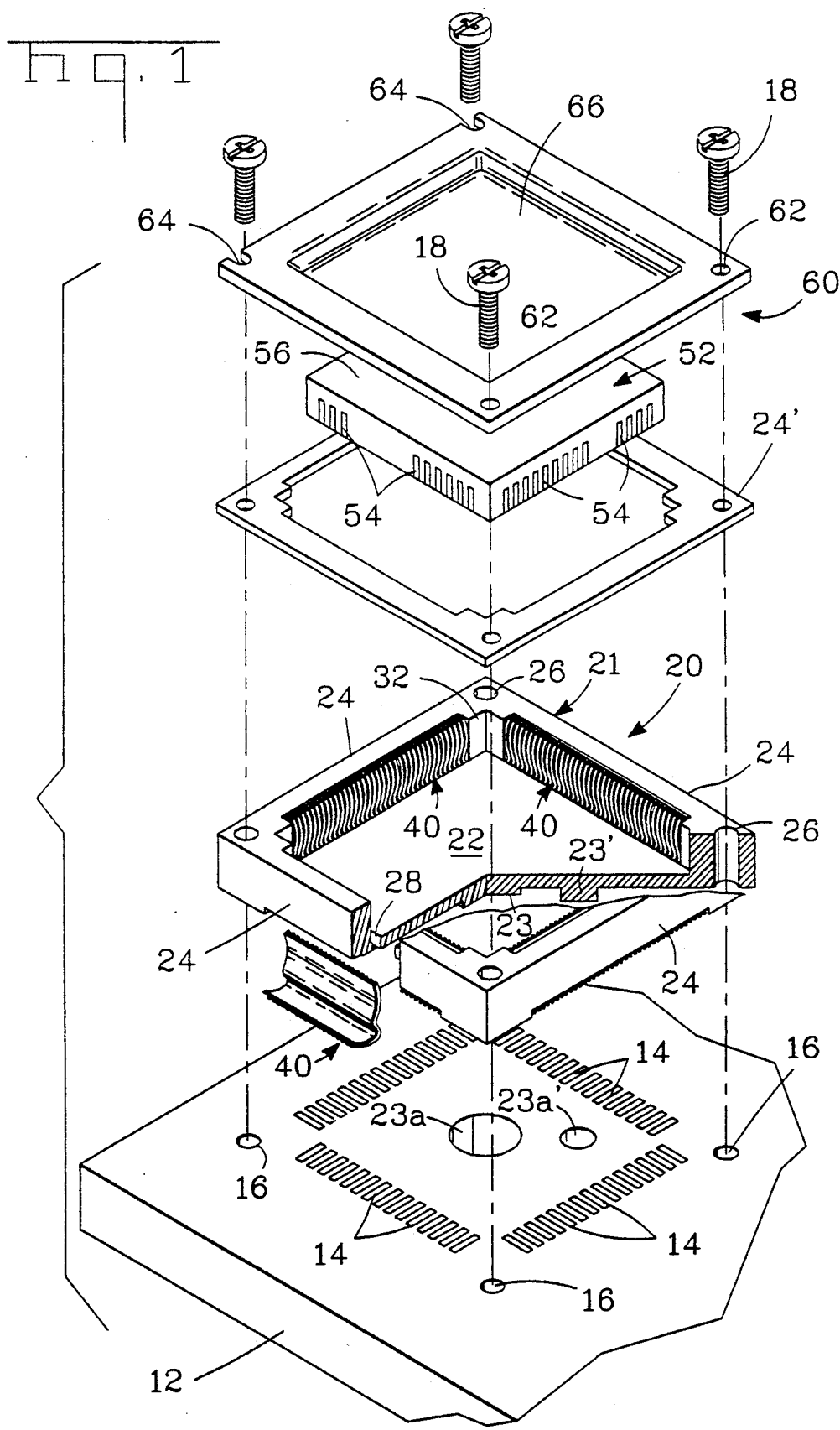
FIG. 1 is a perspective and schematic view, showing parts of the connector assembly of the present invention exploded from each other and substantially enlarged from actual size.
Figure 2:
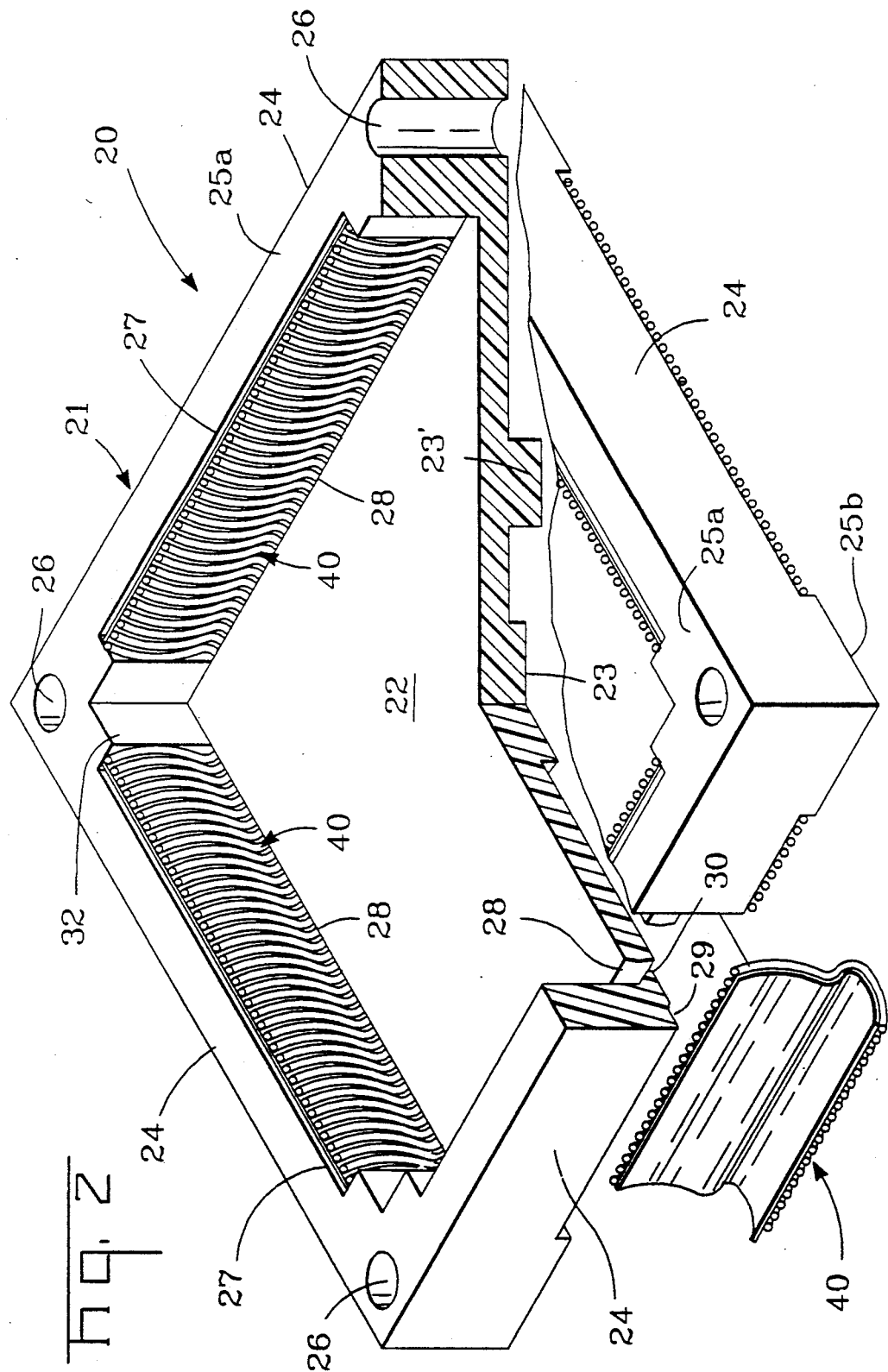
FIG. 2 is a perspective further enlarged view of the connector of FIG. 1.

FIGS. 1 and 2 show an assembly 10 including connector 20 and plate 60 for receiving and securing and electrically engaging circuit pads 54 of electrical component 52 to corresponding contact pads 14 on circuit board 12.

Figure 3:
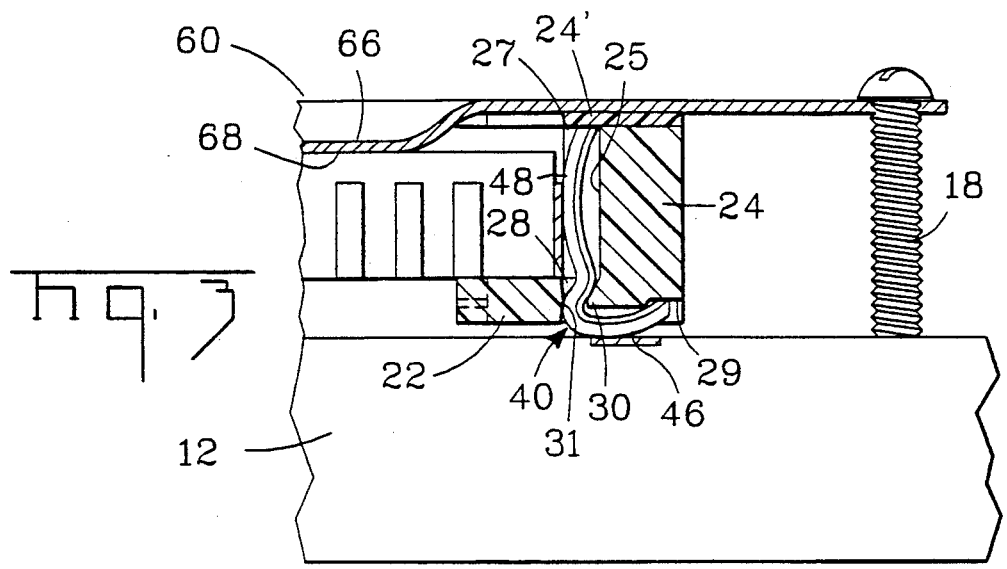
FIG. 3 is an elevational and sectional view showing a portion of the connector assembly shown in FIG. 1 after assembly.

Referring now to FIG. 1, 2 and 3, a circuit board 2 includes a series of conductive pads 14 in the upper surface thereof that are arranged in a pattern and on centerlines compatible with the conductive portions of contact strip 40 of the connector 20. The contact strips 40 of connector 20 have portions which are in turn in a pattern and on centerlines compatible with the contact pads 54 of a component 52.

The board 12 further includes a series of apertures 16, which may include means therein or, on the bottom surface of the board 12, adapted to receive and engage fasteners 18, shown as threaded screws. While not shown, numerous arrays of pads and fastener holes would typically be included on the surface of board 12 with the pads 14 being connected to circuit laminations within the board or on the upper and lower surfaces thereof. Conventional packaging for computers, business machines, communication equipment utilize boards such as 12 in the form of so-called multi-layer boards to mechanically carry and electrically interconnect a variety of components which, together, form a functioning device. A number of the components, particularly the memory and logic modules, certain types of displays, delay devices, and including hybrid devices incorporating discrete resistors, capacitors inductors and the like, are put in components that are then plugably interconnected to the paths of the board. A widely used component package 52 as shown in FIG. 1 includes conductive pads 54 along the sides thereof, which are placed on close centerlines to interconnect the various devices within the package. The pads 54 provide the function provided in other package configurations by tabs, posts, and metal legs extended from the surfaces of the package. The package 52, utilizing pads 54, reduces the area occupied by the package relative to the board 12. This is important for a variety of reasons, including the relatively high cost of multi-layer boards and the relatively short paths from component to component permitted by the reduced size. Short path lengths for interconnections between components reduces delays, signal distortion, and other effects of impedance mismatch and cross-talk of signals between paths.

Figure 4:
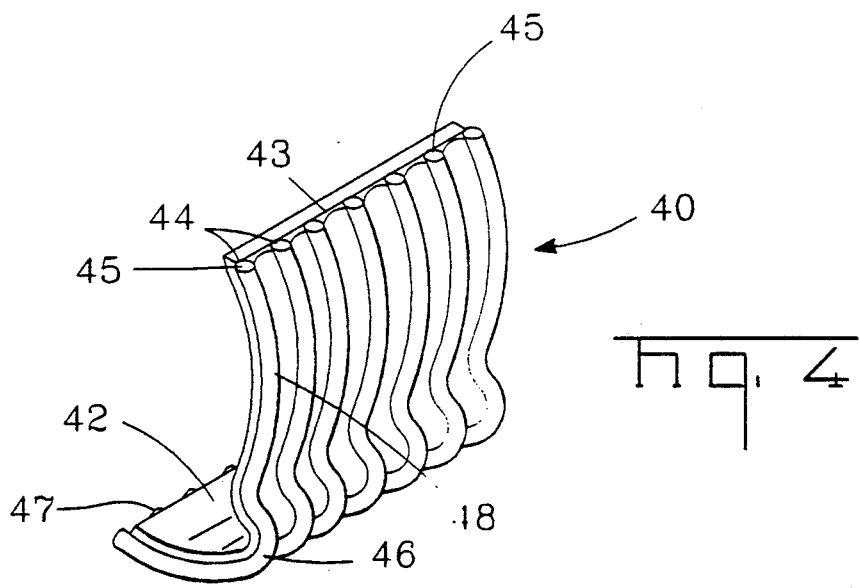
FIG. 4 is a perspective view of the contact lamination, substantially enlarged from the views shown in FIGS. 1, 2 and 3.

The connector 20 is adapted to receive the component 52, hold it in a mechanical sense, and interconnect the circuits therein through the pads 54 to the circuits within board 12 via the pads 14. Connector 20 includes housing 21 having a base 22, and two pairs of opposed sidewalls 24, which together define a cavity 32 for receiving component 52 therein. Housing 21 is formed of a molded plastic material, having suitable dielectric characteristics, a number of widely used engineering plastics being readily available for such purpose. Sidewalls 24 having upper and lower surfaces 25a, 25b, further include mounting apertures 26 for receiving fasteners 18, contact receiving sections 27 defined by inner sidewall surface and slots 28 extending along portions of each sidewall and through base 22. As best seen in FIGS. 1, 2 and 3, each slot 28 is configured to retain the respective contact strip 40 within housing 21 by means of recess 29 extending along the outer lower surface of sidewall 24 and inwardly directed protrusion 30 extending along the lower inner surface of slot 28 which together cooperate with an appropriately configured contact strip 40 to retain the strip in housing 21 as more fully described below. In the preferred embodiment base 22 also, includes a plurality of alignment bosses 23, 23' which cooperate with complementary surfaces 23a, 23a respectively on circuit board 12 to align the connector on the board. As can be discerned in FIGS. 1, 2, 3 and 4, the connector 20 includes on four sides thereof, a laminated contact strip 40 comprised of a sheet or film 42 having an adhesive 43 coated thereon and a series of wires 44 embedded in such adhesive and bonded thereby to film 42. The wire 42 of the contact strip 40 includes selectively plated areas 46 and. 48 thereon in the manner shown in FIG. 4 and also shown in section in FIG. 5. As can best be seen in FIGS. 2 and 3, contact strip 40 is inserted into contact receiving section 27 by inserting first end 45 of contact strip 40 through slot 28 from the bottom of the housing 21 when the contact strip 40 is fully inserted the curved portion thereof is held between protrusion 30 and slot wall 31 of base 22. The leading end 45 of contact strip 40 extends to the upper end of contact receiving section 27 such that plated area 46 lies within cavity 32 of housing 21 and plated area 48 lies along bottom surface 25b of housing 21 with second strip end 47 lying within housing wall recess 29.

The laminated contact strip 40 can be formed in a variety of ways, including the use of the method and process described in the patent heretofore mentioned, U.S. Pat. No. 4,453,309. If such process is used, the ensemble of lamination elements is thereafter flattened, cut into appropriate pieces, and then inelastically deformed into the configuration desired, such as the configuration shown in FIGS. 2 and 3. The selectively plated areas 46,48 are preferably formed by a first coating or plating of nickel onto the wire followed by a plating of precious metal such as gold to a suitable thickness to provide a good contact surface for the contact strip 40. This plating may be accomplished selectively on the wire prior to lamination or subsequent to lamination by a number of well-known techniques of masking and select plating. The wire 44 is preferably a spring grade wire and may be formed, for example, of a four hard phosphor bronze wire having a diameter on the order of 0.006 inches. This will allow the wire to be laminated on centers on the order of 0.010 inches to provide exceedingly close center-to-center spacing to thus assure a redundancy of contact when engaging the contact pads of components and boards which, in typical use, will be several or more pitches wide compared to the 0.010 inch pitch of the wire 44 in the embodiment of FIG. 4. Referring to the aforementioned example of the contact strip 40, it is contemplated that wires of diameters ranging from somewhat less than the 0.006 inches to considerably more than such diameter may be employed by other spring materials, including beryllium copper wire, copper coated steel wire, and the various wires may be plated continuously along the length with a variety of finishes chosen in accordance with the particular contact force generated by the spring involved. The invention also contemplates a variety of insulating sheet materials, ranging from Nomex, a sheet made of fibrous nylon material; a polyester film well-known for electrical uses, or a polyamide film which is somewhat more expensive but has a higher operating temperature range. These films will preferably range from several thousands of an inch in thickness to on the order of 0.010 inches in thickness, depending on application, length of the spring beam required, and other engineering details. In one example of a contact configuration similar to that shown in FIG. 3, the overall width of the contact strip was on the order of 0.1378 inches.

As can be visualized from FIGS. 1 and 3, the assembly 10 further includes a plate element 60 which is held downwardly to clamp the component 52 and the connector 20 to board 12. The plate 60 includes apertures 62 along a side thereof to receive fasteners 18 and slots 64 at the opposite side to receive other fasteners 18. Central of plate 60 is an indentation 66, the undersurface 68 of which, as shown in FIG. 3, bears against an upper surface 56 of the component 52 to effectively clamp it in place. The plate 60 is preferably of a sheet metal and may be given additional volume by including fins or additional mass attached thereto to perform a heat sinking function relative to component 52.

As can be seen in FIGS. 1 and 2, a contact strip 40 is fitted into each slot 28 of the housing 21 with the lower curved portions thereof positioned between the associated wall protrusion 30 and base slot surface 31. The length of the contact strip 40 is made appropriate to the length of a given housing slot 28 relative to the length of the array of contact pads 54 on a side of the component 52. Means not shown but including the use of plastic inserts, adhesive or the like, may be used to fix the length position of a contact strip 40 within the contact receiving passageway 27. As can be seen in FIG. 3, the contact strip 40 is placed under compression relative to the dimension of the contact strip 40 and the housing wall 24, when clamped in place by application of the assembly 10 to board 12. FIGS. 1 and 3 also show the use of insulator housing portion 24' which is configured to lie along the top surfaces 25a of housing walls 24 and extend over the upper end of contact receiving cavity 27, thereby providing electrically insulating means between the ends 45 of contact wires 44 and plate 60 used to secure component 52 within connector 20.

After inserting the contact strips 40, and placing insulator means 24' in position, two of the screws 18 may be inserted through the corresponding apertures 26', 26 of insulator means and housing 21 and into apertures 16 of circuit board 12 to hold the partially assembled article on the board 12. The component 52 is then pressed downwardly into cavity 32 of housing member 21 with the pads 54 engaging the contact areas 46 and driving such contact areas to deform the wires or springs 44 interiorly of the housing walls 24. Thereafter, the plate 60 is placed on top of the component and slid so that the notches 64 slide into engagement with the fasteners 18 and the additional fasteners 18 inserted through the apertures 62, the apertures 26', apertures 26 and into the apertures 16 of the board. The four fasteners 18 may then be turned down to a point of bottoming of a lower surface 46 of the contact strip 40 against the base of frame 22 driven by the engagement of surface 25a with the undersurface 68 of the plate 60, all in the manner as shown in FIG. 3. The projection of the surface 68 engaging the upper surface of component 52 will assure that the component is properly aligned in a vertical sense for appropriate electrical engagement of the contact pads. FIG. 3 shows the component bottoming against base 22. In an alternative embodiment, the component 54 may be given standoff feet to adjust that vertical position or as shown in FIGS. 1 and 2, the connector base 22 may be provided with embossments 23 in the center to provide such standoff and additionally, electrical isolation, if desired. With the component in the position shown in FIG. 3, the contact strip 40 will be compressed in both a vertical sense and in a horizontal sense due to the dimensioning of the connector housing, its interior surfaces, the dimensioning of the contact strip 40, the positioning of the ends thereof, and the dimensions of the package 52, coupled with the clamping provided by plate 60.

The dimensions of the contact strip 40 are chosen to provide a deformation of the contact springs driving the contact areas 46 and 48 against the pads of the component and board under suitable normal forces to provide a stable, low-resistance interface, such normal forces varying in accordance with the finish utilized on the surfaces under engagement. Normal forces on the order of 50 grams or more are generally suitable for gold plated finishes with forces on the order of 150 grams or preferably 200 grams or more are suitable for nonprecious metal finishes such as tin or tin lead. In practical use, the compression of the springs 44 around the point of the projection 30 of the housing results in a movement of the contact points not only inwardly and upwardly, but transversely relative to the paths engaged thereby providing a certain wipe of the contact surfaces engaged which is deemed to be efficacious in terms of clearing the surfaces of oxides or contaminating particles, films, or the like.

Figure 6:
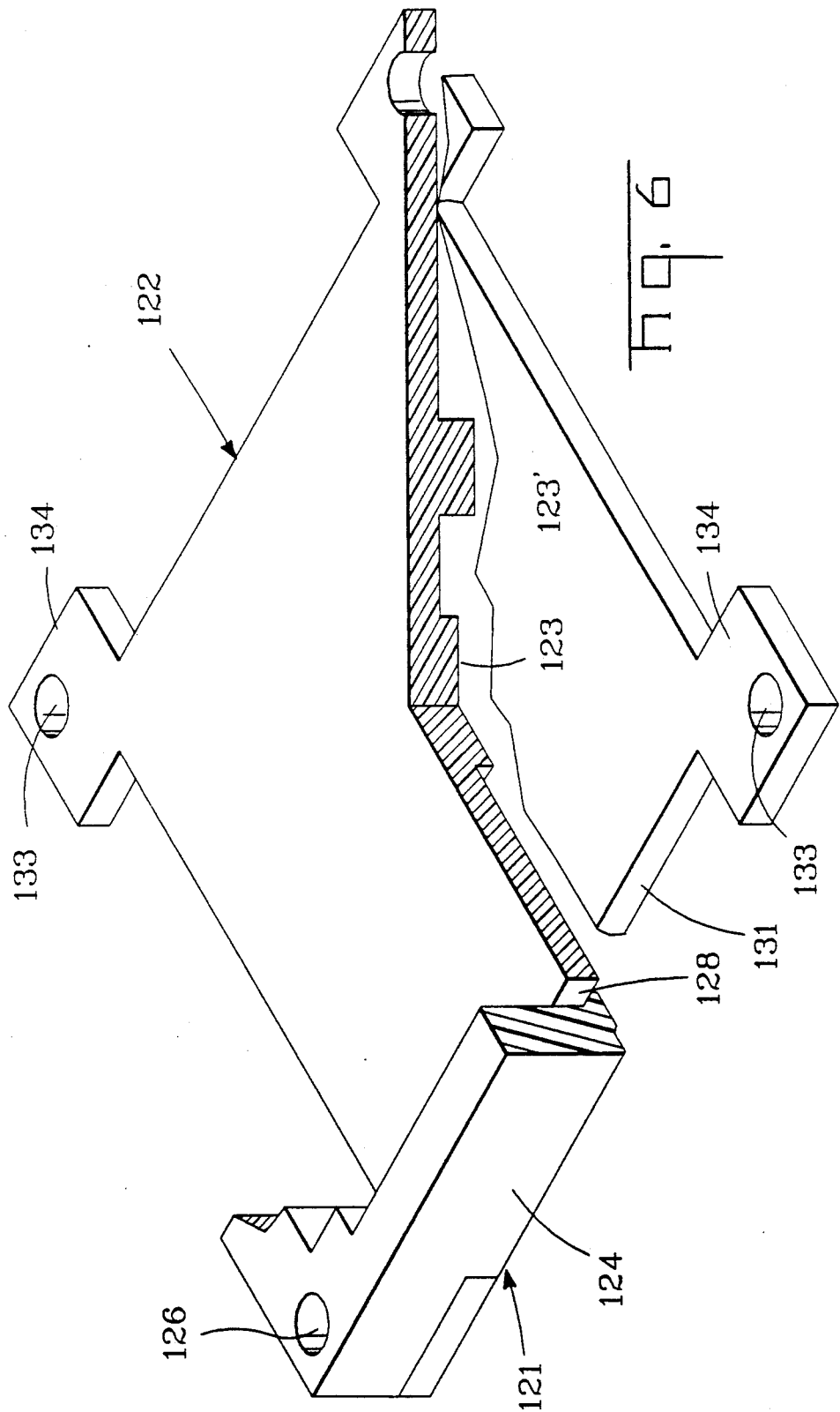
FIG. 6 is a fragmentary perspective view of an alternative embodiment of the invention.

FIG. 6 discloses an alternative embodiment 120 of the connector wherein the housing 121 is comprised of molded base plate 122 having sides 131 and sidewall member 124, which cooperate together to define contact receiving seat 128 for receiving contact strip 40 as previously described. Baseplate 122 and wall member 124 are securable together by fastening means through corresponding apertures 126 in sidewalls 124 and base apertures 134 in base projections 133.

Figure 7:
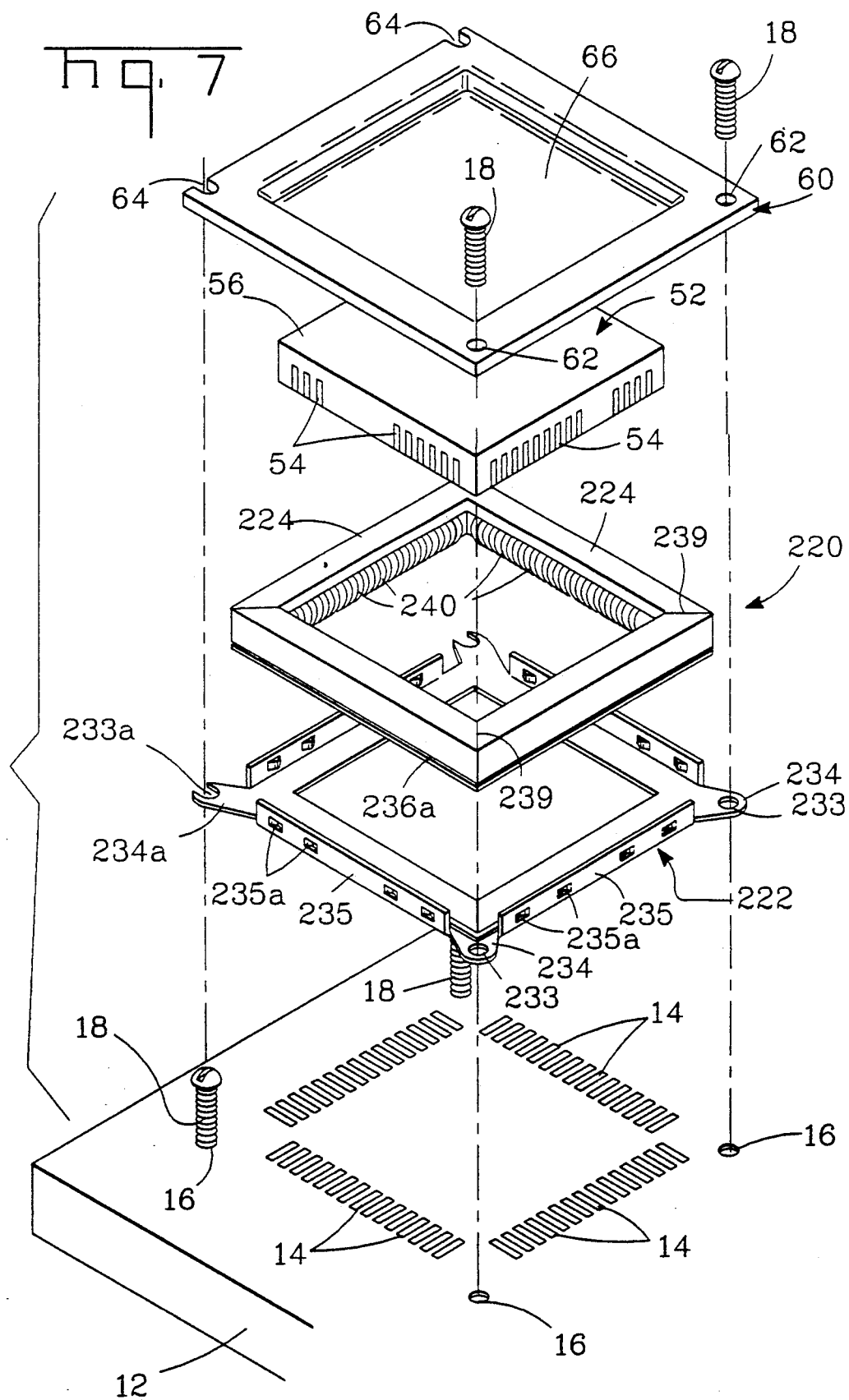
FIG. 7 is a perspective exploded view of a further alternative embodiment of the invention.
Figure 8:
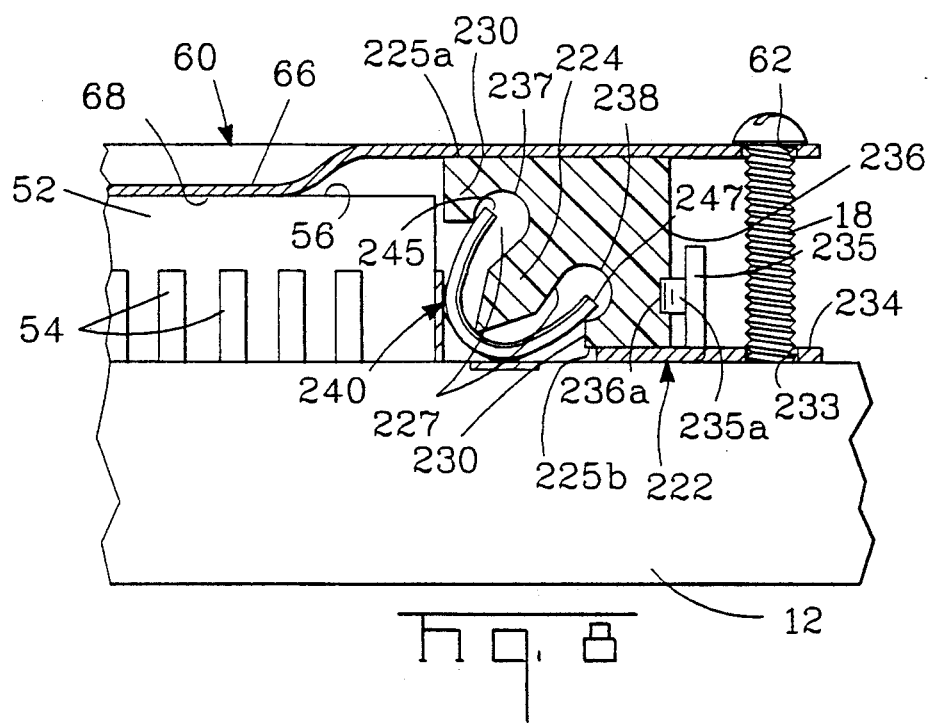
FIG. 8 is an elevational and sectional view of a portion of the assembled embodiment of FIG. 7.
Figure 9:
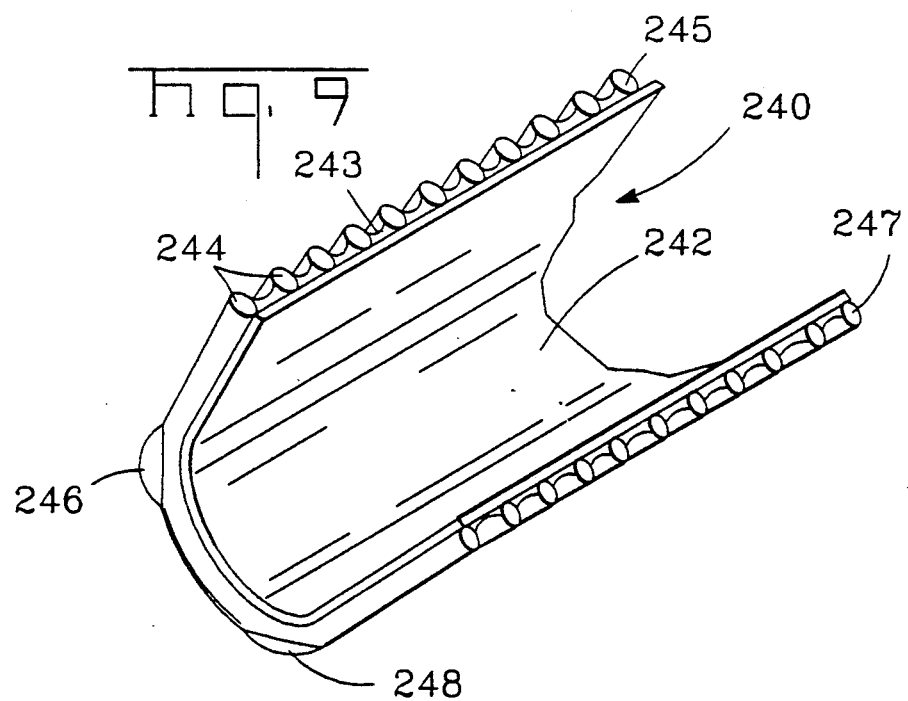
FIG. 9 is a perspective substantially enlarged view of the connector lamination of FIGS. 7 and 8.

FIGS. 7, 8, and 9 illustrate another alternative embodiment 220 of the connector, which includes a metal base frame 222 and housing 221 having side walls 224, which may be formed as a single unit or as four wall portions securable together at corners 239 by adhesive or other means, as known in the art. Base frame 222 is preferably formed from sheet metal material and includes projections 234 extending outwardly from outside edges and having apertures 233 to receive the fasteners 18 passed therethrough into the board apertures 16, as shown in FIG. 7. Opposite to projections 234 are further projections 234a which are slotted at 233a to facilitate the insertion of fasteners 18 at that end of the connector 220 and moreover, to facilitate a sliding engagement with such fasteners 18 in a manner to be described. The four outside edges of the base frame 222 include upstanding walls 235 32, defining component receiving cavity having dimensions slightly larger than plastic dielectric housing walls 224. The base walls 35 include a series of sheared-out embossments 235a, which extend inwardly to engage surfaces of the connector housing walls 224 through a groove 236a therein, shown better in FIG. 8, to lock the housing walls 234 to the frame 222. The housing walls 234 are formed of a molded plastic material having dielectric characteristics suitable for connectors, a number of widely used engineering plastics being readily available for such purpose. When housing 221 is formed from individual wall members, housing walls 234 may be formed by extrusion of the selected material. As can be also seen in FIG. 2, the housing walls 234 include exterior surfaces 236 having the grooves 236a heretofore mentioned therein to receive the projections 235a extended from wall portions 235. Housing walls 234 include an upper surface 225a and a lower surface 225b, which are spaced apart by a precise dimension to control the vertical positioning of the connector 20 relative to board 12.

As can be seen in FIG. 9, the contact strip 240 is fitted into the housing wall 234 by having the ends of the contact strip 40 positioned within the contact receiving cavity 227, which is configured at 237, 238 to receive ends 245, 247 respectively. These surfaces are configured at 227 to facilitate a transverse loading of the strip 40 into these surfaces by a compression of the strip 40 relative to its width and release of the strip thereafter with the ends thereof being held in cavity 227. As can be seen in FIG. 9, the contact strip 240 is also held under compression when the assembly is clamped to board 12. FIGS. 1-9 show an embodiment of the invention adapted to interconnect packages having contact pads on the sides to a printed circuit board having contact pads on the surface thereof.

Figure 10:
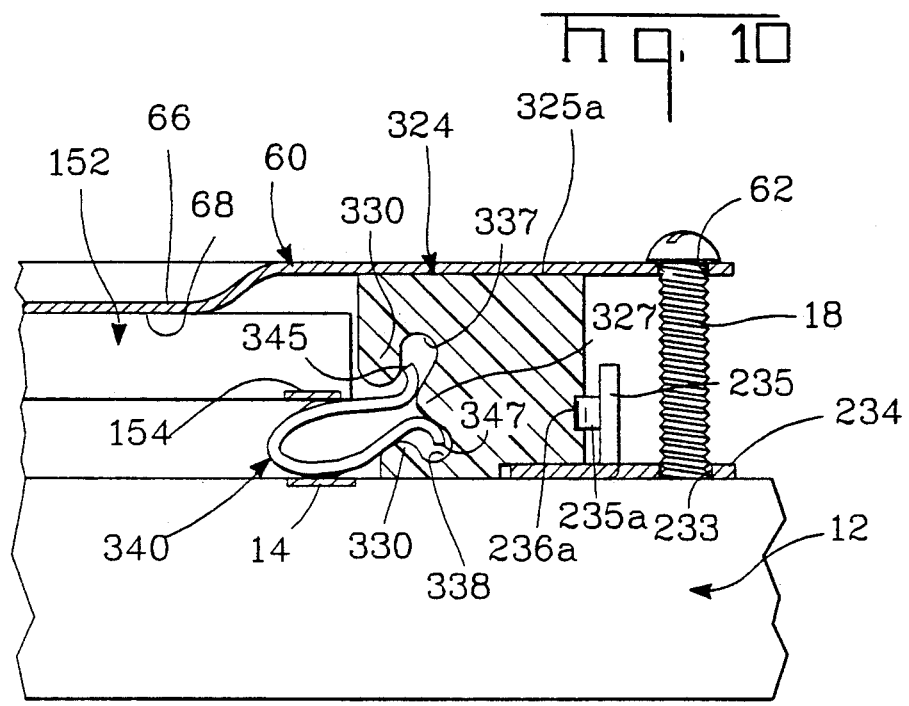
FIG. 10 is a sectional and elevational view of another alternative embodiment of the invention.
Figure 11:
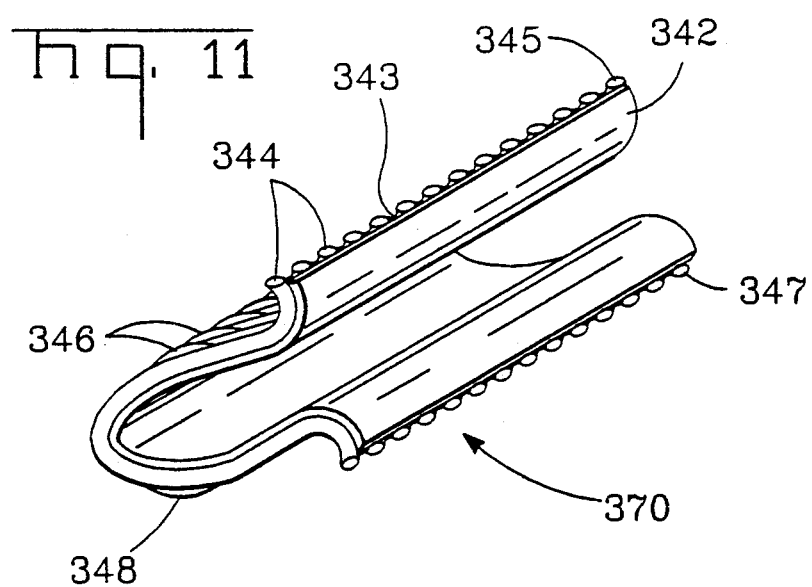
FIG. 11 is a perspective view of the contact lamination shown in section on FIG. 10.

Referring now to FIGS. 10 and 11, another alternative embodiment 330 of the connector is shown wherein identical elements to the earlier embodiments carry identical enumeration. Thus, in FIG. 10, the basic elements of board 12, fasteners 18, frame 222, and plate 60 are all as previously described. The housing 324 includes a different interior surface defined by contact receiving cavity 327, interior surfaces 337 and 338, as well as the projections 330. The component 152 includes conductive pads 154 located on the lower surface thereof. The board 12 includes the same contact pads 14 as heretofore mentioned. The contact strip 340 is substantially identical to that shown in the Figures illustrating the earlier embodiment and includes an insulating sheet 342 and adhesive 343 and contact springs 344 carrying contact areas 346 and 348. The contact strip 340 is configured as shown in FIGS. 10 and 11 and has a different cross-sectional configuration to place the contact areas 346 and 348 in position to interconnect the downwardly facing contact pad 154 of package 152 and the pad 14 of board 12. The ends of the contact element are given a configuration to fit within the altered interior surfaces of contact receiving cavity 327 of the housing element 324 as shown in FIG. 10 with a suitable clearance allowing the inward deformation elastically of the strip 340 to be fitted therewithin and upon release of compression relaxed to a point of engagement with the interior surfaces to hold the strip in place. Again, means not shown including plastic elements may be fitted within the ends of the interior surfaces to align the contact strips before use.

Figure 5:
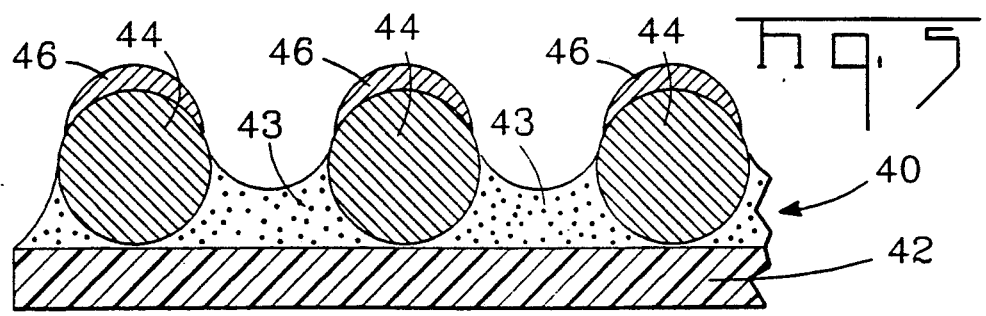
FIG. 5 is a sectional view taken through lines 5—5 of FIG. 4 and substantially enlarged to show the details of the wire lamination.

As can be observed in the embodiments FIG. 5 and 10, the housing elements 224 and 324 are rendered in a cross-sectional configuration compatible with extrusion processes. This is contemplated as well as housings formed by traditional molding wherein the housings are relieved along the length thereof in order to admit core pins in closure of a mold establishing interior surfaces sequentially along the length of the housing elements. Use of extrusion and/or molding of the housing elements is contemplated, depending upon the volume of a particular housing production run, the tolerance maintainable by the several processes and the overall size of the connector involved.

Having now described the invention in terms intended to enable a preferred practice of the several embodiments, claims are appended which are intended to define what is deemed to be inventive.

I claim:

1. An electrical connector for use in interconnecting the contact pads of a circuit component to the contact pads of a circuit board characterized in that said pads are on given close centerlines for high density packaging, the connector comprising a housing including portions arranged to surround said component and including an interior cavity opening inwardly relative to such component, said cavity including interior surfaces positioned to retain and position a contact strip fitted into said cavity and carrying a dimension to facilitate deformation of said contact strip in a direction transversely of the length thereof, said contact strip being comprised of an insulating film having a plurality of wires bonded thereto by adhesive, each wire being of spring grade material, said wires being held on said given centerlines and insulated from one another by said adhesive with surfaces of said wire exposed in at least two spaced apart areas along the length of the given wire, said contact strip being inelastically deformed into a generally U-shaped cross-sectional configuration with the ends thereof engaged in and held by the interior surfaces of said housing portion under slight compression of the contact strip wire, said housing being comprised of multiple elements with said contact strips fitted individually therein, said elements being held together and in position by a frame member including portions engaging complementary portions of said housing elements and means for aligning and holding said housing portion and said contact strip relative to the said component and circuit board pads with one of the said two contact areas in resilient contact with the pads of the component and the other of said areas in resilient engagement with the pads of the circuit board to electrically interconnect the pads of the component to the pads of the circuit board.

2. The connector of claim 1 wherein each of said housing elements has a cross-sectional profile facilitating extrusion and said means includes a metallic bracket to hold said elements in functioning relationship.

3. The connector of claim 1 Wherein the said interior cavity includes a relief to facilitate the compression of the U-shaped configuration of the contact strip for insertion within the housing element to be retained therein.

4. The connector of claim 1 wherein said component includes pads on the sides thereof and contact areas of said contact strip are oriented to interconnect said pads to said circuit board.

5. The connector of claim 1 wherein the said component includes contact pads on the bottom thereof and said contact strip includes contact areas positioned to engage said component pads and interconnect said component pads to the pads of the circuit board.

6. The connector of claim 1 wherein the said interior surfaces include a projection engaging the insulating film in a manner whereby deflection of the contact strip by the pads of the component and circuit board effects a wiping of surfaces of said pads.

7. The connector of claim 1 wherein the said contact strip is formed of a insulating and dielectric film sheet on the order of substantially less than 0.010 inches in thickness and said wires are formed of material having an outer diameter on the order of less than 0.010 inches in diameter.

* * * * *